United States Patent [19]

Pricer et al.

[11] 4,322,823

[45] Mar. 30, 1982

[54] STORAGE SYSTEM HAVING BILATERAL FIELD EFFECT TRANSISTOR PERSONALIZATION

[75] Inventors: Wilbur D. Pricer, Burlington; James E. Selleck, Middlebury, both of Vt.

[73] Assignee: International Business Machines Corp., Armonk, N.Y.

[21] Appl. No.: 126,636

[22] Filed: Mar. 3, 1980

[51] Int. Cl.$^3$ .............................................. G11C 11/40
[52] U.S. Cl. .................................... 365/184; 365/174; 357/23
[58] Field of Search .................. 357/23; 365/174, 184

[56] References Cited

U.S. PATENT DOCUMENTS

| | | | |
|---|---|---|---|
| 3,914,855 | 10/1974 | Chevey | 29/571 |
| 4,045,811 | 8/1977 | Dingwall | 357/45 |
| 4,052,229 | 10/1977 | Pashley | 365/184 |
| 4,096,522 | 6/1978 | Suyuki et al. | 357/45 |
| 4,142,926 | 3/1979 | Morgan | 148/187 |
| 4,161,039 | 7/1979 | Rossler | 365/185 |
| 4,214,359 | 7/1980 | Kahng | 29/571 |

OTHER PUBLICATIONS

"Double Diffused MOS Transistor Achieves Microwave Gain", T. P. Cauge et al., *Electronics*, Feb. 15, 1971, pp. 99–104.

"A 100 ns 150 mW 64 K Bit ROM", D. R. WILSON et al., *1978 IEEE International Solid–State Circuits Conference, Digest of Technical Papers*, vol. XXI, pp. 152, 153 and 273.

Primary Examiner—Terrell W. Fears
Attorney, Agent, or Firm—Stephen J. Limanek

[57] ABSTRACT

A storage system, such as a read only memory, is provided which includes field effect transistors each having first and second spaced apart diffusion regions of a given conductivity and a gate electrode, with at least one of the two diffusion regions of selected transistors having a third diffusion adjacent to one of the first and second diffusion regions under the gate electrodes to provide a higher voltage threshold for the gate electrode to one diffusion than for the gate electrode to the other of the two diffusions. A voltage is applied to the first diffusion having a polarity and magnitude sufficient to neutralize or eliminate the effects of the higher threshold during a first time period and the current flowing between the first and second diffusions is sensed. During a second period of time the voltage is applied to the second diffusion and the current flow between the first and second diffusions is again sensed. In this manner two cells or bits of information are stored in each transistor, one at the first diffusion and one at the second diffusion. Multilevel storing may also be employed by establishing one of more than two predetermined voltage thresholds at each of the first and second diffusions.

15 Claims, 6 Drawing Figures

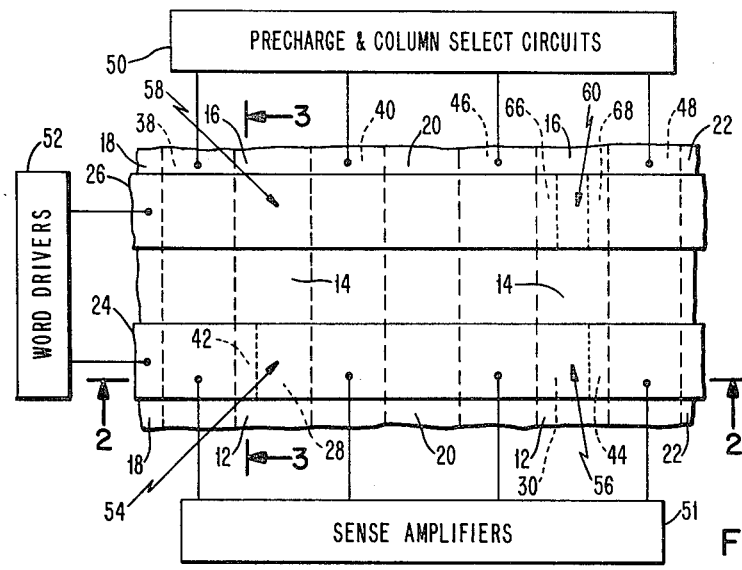
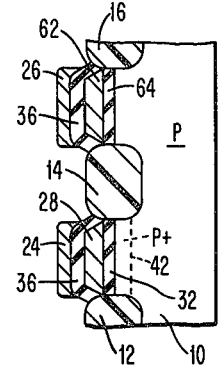
FIG. 3
FIG. 1
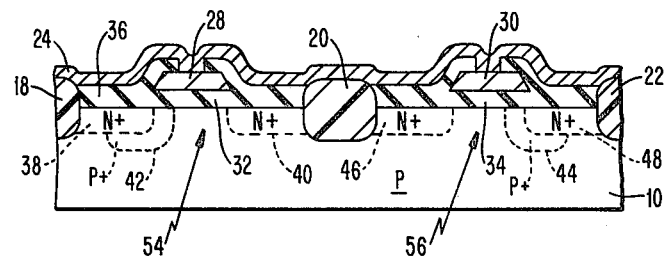
FIG. 2
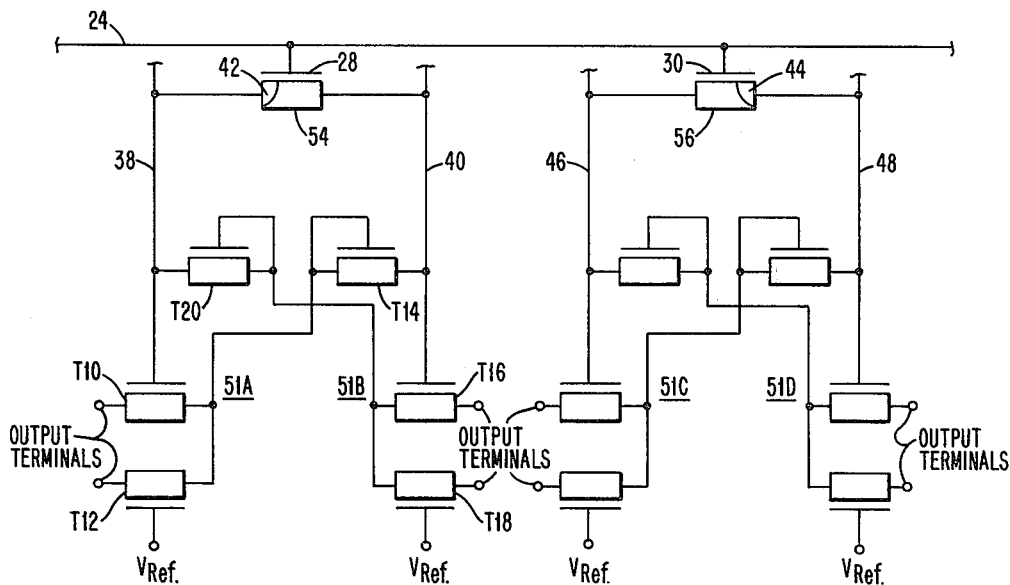
FIG. 4

STORAGE SYSTEM HAVING BILATERAL FIELD EFFECT TRANSISTOR PERSONALIZATION

DESCRIPTION

Technical Field

This invention relates to integrated semiconductor circuits and more particularly to a storage system or transistor array which may be used, e.g., in read only memories.

Background Art

Integrated semiconductor circuits, particularly systems or arrays having transistors each of which represents a binary digit of information, as in read only memories (ROM), have achieved high device or cell densities.

In, e.g., U.S. Pat. No. 3,914,855, filed May 9, 1974, there is described a read only memory wherein the array has transistors made with a thin gate dielectric exhibiting a low threshold voltage for storing one digit of binary information and transistors made of a thick gate dielectric exhibiting a considerably higher threshold voltage for storing the other digit of binary information. This patent also describes a read only memory wherein the array is encoded by etching apertures in the gate electrodes of selected devices and implanting ion impurities through the apertures to render the selected devices inoperative, thus defining one digit of binary information, while the remaining devices which do not have apertures in the gate electrode and operative devices or transistors defining the other digit of binary information. The read only memories employing the thick and thin gate dielectrics have a high cell density but the personalization of the memory cells must be made during the early steps of the process, whereas the read only memories having apertures in the gate electrodes require a relatively wide gate electrode or word line and, therefore, sacrifice density.

A read only memory disclosed in U.S. Pat. No. 4,096,522, filed Aug. 8, 1977, is personalized at a relatively late stage during the processing thereof by completing connections between the source and drain electrodes and the channel region of the transistors after the gate electrodes of the transistors have been formed. However, this process sacrifices density since a gap or space must be provided near each gate electrode to complete by ion implantation the source and drain electrodes on the transistors selected for storing one digit of binary information while that gap or space serves as an open circuit in transistors selected for storing the other digit of binary information.

U.S. Pat. No. 4,045,811, filed Aug. 4, 1975, describes a read only memory wherein selected transistors are made non-operative or with a high threshold by providing diffused regions under the gate electrodes in the channel regions which serve to raise the value of the transistors during the operation of the memory. These diffused regions are formed in the channel regions during a relatively early step in the process and prior to forming the gate electrodes.

In U.S. Pat. No. 4,161,039, filed Feb. 6, 1978, there is disclosed a memory array utilizing field effect transistors wherein information is stored in floating gates and the channel region is made short by employing double-diffusion processing techniques, as disclosed in more detail in "Electronics", Feb. 15, 1971, at pages 99–104. This memory is not a simple read only memory but it can be reprogrammed by erasing the stored information with ultraviolet light.

Commonly assigned U.S. Patent application having Ser. No. 068,282, filed Aug. 20, 1979, by A. G. Fortino et al describes and claims a method of making a read only memory system which includes forming a plurality of gate electrodes defining channels in and insulated from a semiconductor substrate having a given conductivity, e.g., P type, forming diffusion regions with a first impurity, e.g., arsenic, of a conductivity opposite to that of the given conductivity in the semiconductor substrate defined by edges of the gate electrodes, introducing a second impurity, e.g., boron, having the given conductivity into selected diffusion regions, the second impurity having a higher diffusivity in the semiconductor substrate than that of the first impurity, and driving the second impurity along the surface of the semiconductor substrate to alter the conductivity of the channels adjacent the selected regions. The transistors with boron in their channel have a high threshold voltage for storing one digit of binary information, whereas the remaining transistors, having a significantly lower threshold voltage, store the other digit of binary information, in a very compact read only memory system.

Disclosure of the Invention

It is an object of this invention to provide an improved transistor array which has a high density of transistors with predetermined threshold voltages.

It is another object of this invention to provide an improved read only memory transistor array wherein the step at which the array is programmed or personalized is during the late stages of the process for making the transistors.

It is still another object of this invention to provide an improved read only memory transistor array having high density of transistors with predetermined threshold voltages.

It is yet another object of this invention to provide an improved read only memory which has a high density of field effect transistors wherein each of the transistors may have two predetermined threshold voltages and wherein the memory is programmed or personalized during the late stages of the process for making the transistors.

It is a further object of this invention to provide an improved read only memory which has a high density of field effect transistors wherein each of the transistors may have two of several predetermined threshold voltages.

It is yet a further object of this invention to provide an improved read only memory system having a plurality of field effect transistors wherein each transistor is programmed to store two binary digits of information.

In accordance with this invention, a storage system is provided which includes field effect transistors each having two spaced apart diffusions with at least one of the two diffusions of some of the transistors having a high threshold. Means are provided for applying to one high threshold diffusion a voltage having a polarity and magnitude sufficient to neutralize the high threshold of the one diffusion. The system also includes means for determining current flow between the two spaced apart diffusions when the one diffusion has its high threshold neutralized. With the neutralizing voltage applied to the one diffusion of the two diffusions, the one diffusion acts as the drain of the transistor with the other diffusion of the two diffusions acting as the source of the transistor. Thus, if the other or source diffusion also has a high threshold, then little or no current flows between the two spaced apart diffusions when a gate voltage of, say, 5 to 10 volts is applied to the gate electrode of the transistor, which current value indicates the presence of, e.g., a "1" digit of binary information being stored at the other diffusion of the two diffusions. However, if the other or source diffusion has a low threshold, then a relatively high current flows between the two spaced apart diffusions when the gate voltage is applied to the gate electrode of the transistor, which current value indicates the presence of, e.g., a "0" digit of binary information being stored at the other diffusion of the two diffusions.

With the neutralizing voltage applied to the other diffusion of the two diffusions, the other diffusion now acts as the drain of the transistor with the one diffusion now acting as the source of the transistor. Accordingly, with this arrangement the presence of a "1" digit or "0" digit of information stored at the one diffusion can also be detected.

Of course, if the neutralizing voltage is not required to neutralize a high threshold diffusion, then this voltage will be used simply as the drain voltage tending to pass current between the two spaced apart diffusions dependent upon the existence or non-existence of a high threshold diffusion at the source of the transistor.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIG. 1 illustrates in substantially plan view a read only memory having a transistor array and circuitry arranged in accordance with the teachings of this invention, FIG. 2 is a sectional view of the array of FIG. 1 taken through line 2—2 thereof, FIG. 3 is another sectional view of the array of FIG. 1 taken through line 3—3 thereof, FIG. 4 is a sense amplifier circuit that may be used in the embodiment of the invention illustrated in FIGS. 1-3 of the drawings.

BEST MODE FOR CARRYING OUT THE INVENTION

Figure 5:
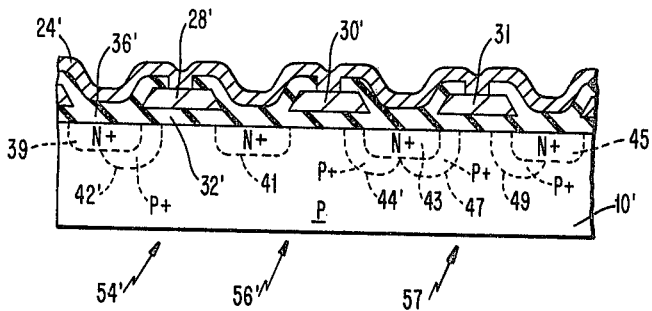
FIG. 5 is a sectional view similar to that of FIG. 2 of another array of a second embodiment of the present invention.

Referring to FIGS. 1, 2 and 3 of the drawing in more detail, there is shown one embodiment of a read only memory of the present invention. The read only memory includes a semiconductor substrate 10 made of P type conductivity in which there is formed recessed oxide segments 12, 14 and 16 seen more clearly in FIG. 3 of the drawing, which is a sectional view taken through line 3—3 of FIG. 1, and recessed oxide strips 18, 20 and 22 as seen more clearly in FIG. 2 of the drawing, which is a sectional view taken through line 2—2 of FIG. 1. A first word line 24 is disposed between the recessed oxide segments 12 and 14, as indicated in, e.g., FIG. 3, and a second word line 26 is disposed between the recessed oxide segments 14 and 16. The first and second word lines 24 and 26 may be made of metal such as aluminum or other suitable conductors. The first word line 24 is connected to a gate electrode 28 which is separated from the semiconductor substrate 10 by a thin dielectric layer 32, made preferably of silicon dioxide, and also to a gate electrode 30 which is separated from the semiconductor substrate 10 by a thin dielectric layer 34, also made preferably of silicon dioxide. Although for purposes of clarity the word line 24 is shown connected to the gate electrodes over channel regions, in practice the contacts could be made as well over the isolation segments or strips, or a polysilicon word line could be used which would also act as the gate electrodes. The first and second word lines 24 and 26 are insulated from the semiconductor substrate 10 by a thick insulating layer 36.

A first N+ diffusion region 38 is formed in semiconductor substrate 10 between the gate electrode 28 and the recessed oxide strip 18 and a second N+ diffusion region 40 is formed in semiconductor substrate 10 between the gate electrode 28 and the recessed oxide strip 20, as indicated in, e.g., FIG. 2 of the drawing. The first and second N+ diffusion regions 38 and 40 define the channel region under gate electrode 28. A first halo-like P+ region 42 is disposed in the semiconductor substrate 10 adjacent to the first N+ region 38 and between the first N+ region 38 and the second N+ region 40 and a second P+ region 44 is disposed in semiconductor substrate 10 adjacent to a fourth N+ diffusion region 48 and between the fourth N+ region 48 and a third N+ diffusion region 46. The third N+ region 46 is formed in semiconductor substrate 10 between gate electrode 30 and recessed oxide strip 20 and the fourth N+ diffusion region 48 is formed in semiconductor substrate 10 between the gate electrode 30 and recessed oxide strip 22. The third and fourth N+ diffusion regions 46 and 48 define the channel region under gate electrode 30. The first, second, third and fourth N+ diffusion regions 38, 40, 46 and 48, respectively, are connected at one end to precharge and column select circuits 50, which may be of any known appropriate type, and at the other end to sense amplifiers 51. The first and second word lines 24 and 26 are connected to word drivers 52, which may also be of any known appropriate type.

The embodiment of the read only memory shown in FIGS. 1, 2 and 3 of the drawing illustrates an array of four transistors 54, 56, 58 and 60, with transistors 54 and 56 being associated with the first word line 24, as can be seen in FIG. 2, and with transistors 58 and 60 being associated with the second word line 26. The first transistor 54 is formed by gate electrode 28 and first and second N+ regions 38 and 40, as well as the first P+ region 42 formed at the edge of the first N+ region 38 under gate electrode 28. The second transistor 56 is formed by the gate electrode 30 and the third and fourth N+ regions 46 and 48, as well as the second P+ region 44 formed at the edge of the fourth N+ region 48 under gate electrode 30. The third transistor 58 associated with the second word line 26 includes a gate electrode 62, indicated in FIG. 3 of the drawing, spaced from semiconductor substrate 10 by a thin dielectric layer 64, which is also made preferably of silicon dioxide, and the first and second N+ diffusion regions 38 and 40. The fourth transistor 60, also associated with the second word line 26, includes a gate electrode (not shown) and the third and fourth N+ diffusion regions 46 and 48, along with third and fourth P+ regions 66 and 68, as indicated in FIG. 1 of the drawing.

For a better understanding of the method for making the transistor array of the read only memory illustrated in FIGS. 1, 2 and 3, reference may be had to the above identified A. G. Fortino et al U.S. Patent application Ser. No. 068,282.

It should be noted that arsenic may be introduced into the semiconductor substrate 10 by known ion implantation techniques to provide the N+ regions 38, 40, 46 and 48 and that boron may be introduced into the semiconductor substrate 10 by techniques described in the A. G. Fortino et al Patent application to provide the P+ regions 42, 44, 66 and 68 for forming high thresholds for N+ diffusions 38 and 48 and associated gate electrodes 28 and 30, respectively, in first word line 24 and for N+ diffusions 46 and 48 and associated gate electrode 62 in second word line 26, respectively. The arsenic used to form N+ regions 38, 40, 46 and 48 is preferably implanted with a concentration of about $8 \times 10^{-}$ions per square centimeter at 80 KeV and the boron dose used to make the P+ regions 42, 44, 66 and 68 is preferably implanted with a concentration of $4-8 \times 10^{-}$ions per square centimeter at 100-200 KeV when using a voltage of approximately 5 volts on the first and second word lines 24 and 26.

The storage system of the present invention as illustrated in FIGS. 1-3 may be operated by applying appropriate pulses from the precharge and column select circuits 50, of any known appropriate type, to the N+ diffusion regions 38, 40, 46 and 48 and from the word drivers 52 to the word lines 24 and 26, and detecting the sense signals in the sense amplifiers illustrated in FIG. 4 of the drawings.

As indicated in FIGS. 1-3 of the drawings and as explained hereinabove, transistor 54 includes N+ diffusion region 38 having a high threshold produced by P+ diffusion region 42 and N+ diffusion region 40 which does not have a P+ diffusion region associated therewith and, therefore, has a low threshold. Accordingly, transistor 54 has two memory cells each storing a binary digit of information and defined by the presence or absence of a P+ diffusion region. In transistor 54, a "1" digit of binary information is stored in the left side due to the presence of P+ region 42 and a "0" digit of binary information is stored in the right side due to the absence of a P+ region at the edge of N+ region 40 under gate electrode 28.

In FIG. 4 of the drawing, N+ diffusion regions 38 and 40 and P+ diffusion region 42 of transistor 54 are schematically illustrated, along with the gate electrode 28 which is connected to the first word line 24. To determine what binary digit is stored in the right side of transistor 54, i.e., to determine the presence or absence of a P+ region adjacent to N+ region 40, all N+ diffusion regions 38, 40, 46 and 48, forming bit sense lines, are charged to a positive potential VH, say, to +5 volts, and then bit sense line 40 is grounded and a voltage of, say, +5 volts is applied to word line 24. Since +5 volts is charged to bit sense line 38 and since the boron concentration is not high, i.e., about $4-8 \times 10^{13}$ ions per square centimeter, the adjacent P+ or boron region or halo 42 is depleted of holes to neutralize the presence of the P+ region 42 and current conducts through the channel region of transistor 54 which tends to discharge the voltage on bit sense line 38, indicating the storage of a "0" digit in the right side of transistor 54. The decrease in voltage on bit sense line 38 is detected by a first differential sense amplifier 51A having amplifying transistors T10 and T12 and a control transistor T14 connected to grounded bit sense line 40. It can be seen that with control transistor T14 connected as a diode, bit sense line 40 acts as a source for transistors T10 and T12 with the current passing through transistor T10 being dependent upon the voltage on bit sense line 38 and the current passing through transistor T12 being dependent on a reference voltage $V_{Ref.}$ applied to the gate electrode of transistor T12. The voltage $V_{Ref.}$ has, preferably, a voltage value midway between the voltage on bit sense line 38 when a "0" digit is stored and when a "1" is stored. If desired, the gate electrode of transistor T12 may be connected to a dummy cell instead of to voltage $V_{Ref.}$, as is known.

To determine what binary digit is stored in the left side of transistor 54, i.e., to determine the presence or absence of a P+ region adjacent to N+ region 38, all N+ diffusion regions are again charged to a positive potential VH and then the bit sense line 38 is grounded and the voltage of +5 volts is applied to word line 24. With this arrangement, current does not flow through the channel region of transistor 54 and, therefore, the voltage on bit sense line 40 remains at a high level indicating the presence of a P+ region or halo adjacent to N+ region 38 and the storage of a "1" digit of binary information. The voltage on bit sense line 40 is detected by a second differential sense amplifier 51B having amplifying transistors T16 and T18 and a control transistor T20 connected to grounded bit sense line 38. It can again be seen that with control transistor T20 connected as a diode, bit sense line 38 acts as a source for transistors T16 and T18 with the current passing through transistor T16 being dependent upon the voltage on bit sense line 40 and with transistor T18 being dependent upon voltage $V_{Ref.}$.

It should be noted that the output terminal for transistors T10, T12, T16 and T18 may be connected to a final difference amplifier located also on substrate 10. If desired, the final amplifier may be a single-ended amplifier in which case the output terminals for, e.g., transistors T12 and T18 may be connected to the voltage VH.

It can be seen that to read out the two digits stored in transistor 56 a similar method of operation is employed. When reading the right side of transistor 56 current does not flow through the channel of transistor 56 due to the presence of P+ region 44 and, therefore, the voltage on bit sense line 46 remains high indicating the storage of a "1" digit in the right side of transistor 56. The presence of this high voltage on line 46 is detected by a third sense amplifier 51C which operates in a manner similar to that of sense amplifiers 51A and 51B. When reading the left side of transistor 56 a relatively high current, indicative of a "0" digit, flows through the channel of transistor 56 since the voltage VH on bit sense line 48 depletes the P+ region 44 of holes to neutralize the presence of the P+ region 44.

With transistor 58 including only N+ diffusion regions 38 and 40, without the presence of a P+ region, a "0" digit of information is stored in the right side and in the left side of transistor 58. Accordingly, sense amplifier 51A detects a voltage drop in line 38 when sensing the right side of transistor 58 and sense amplifier 51B detects a voltage drop in line 40 when sensing the left side of transistor 58.

With transistor 60 having a P+ region 66 associated with N+ diffusion region 46 and a P+ region 68 associated with N+ diffusion region 48, a "1" digit of information is stored in each side of transistor 60. Accordingly, sense amplifier 51C detects the high voltage remaining on line 46 and sense amplifier 51D detects the high voltage remaining on line 48 when the memory cells in the right and left sides of transistor 60 are being sensed or read out.

To provide a more dense array for the storage system of the invention, the recessed oxide strips 18, 20 and 22 may be eliminated as indicated in the array illustrated in FIG. 5 in a sectional view similar to that of FIG. 2 of the drawings to provide a second embodiment of the present invention.

In this second embodiment, the array includes a thin dielectric layer 32' interposed between gate electrodes 28', 30' and 31 and the surface of a semiconductor substrate 10', with a thicker layer of insulation 36' being interposed between a word line 24' and the surface of substrate 10'. N+ diffusion regions 39, 41, 43 and 45, defined by gate electrodes 28', 30' and 31, are formed in substrate 10' at the surface thereof. A P+ region or halo 42' is disposed under gate electrode 28' adjacent to N+ region 39, a P+ region 44' is disposed under gate electrode 30' adjacent to N+ region 43 and P+ regions 47 and 49 are disposed under gate electrode 31 adjacent to N+ regions 43 and 45, respectively. Transistor 54' is defined by gate electrode 28' and N+ regions 39 and 41, transistor 56' is defined by gate electrode 30' and N+ regions 41 and 43 and transistor 57 is defined by gate electrode 31 and N+ regions 43 and 45. As can be seen from FIG. 5 of the drawings, transistor 54' stores a "1" digit in its left side due to the presence of P+ region 42', while storing a "0" in its right side due to the absence of a P+ region adjacent to and under gate electrode 28'. Transistor 56' stores a "0" in its left side and a "1" in its right side, and transistor 57 stores a "1" in both its left and right sides.

Figure 6:
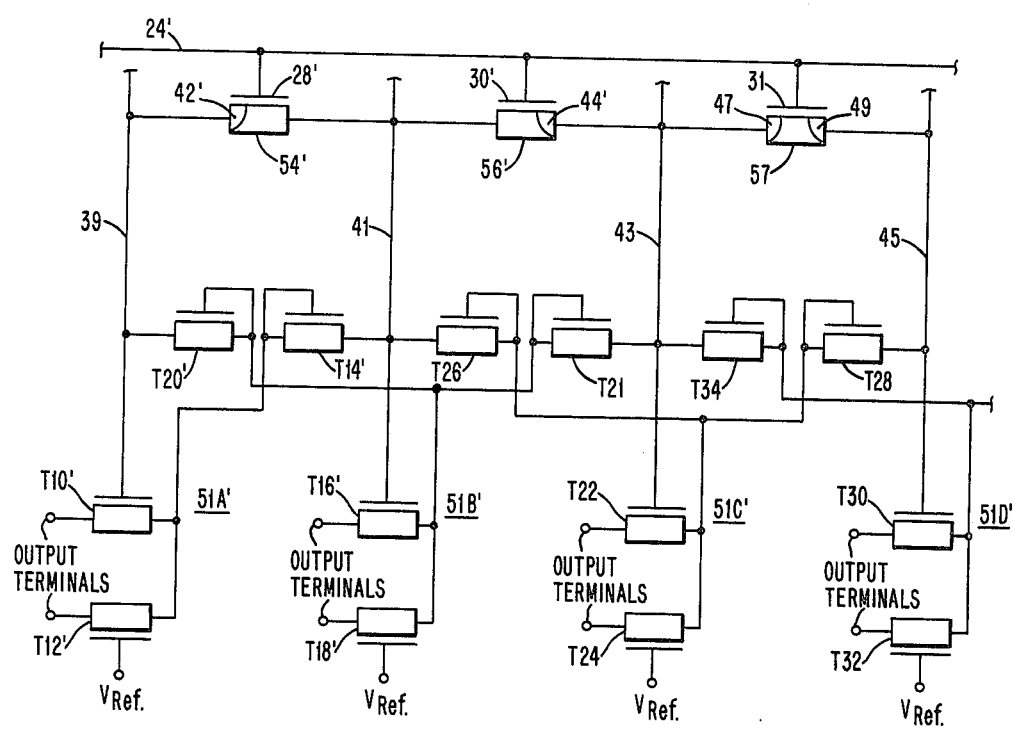
FIG. 6 is a sense amplifier circuit that may be used in the second embodiment of the invention illustrated in FIG. 5 of the drawing.

In FIG. 6 of the drawings, N+ diffusion regions 39, 41, 43 and 45 and P+ diffusion regions 42', 44', 47 and 49 are schematically illustrated, along with the gate electrodes 28', 30' and 31, which form transistors 54', 56' and 57, each coupled to word line 24', also shown in FIG. 5 of the drawings. To determine what binary digit is stored in the right side of transistor 54', all N+ diffusion regions, indicated as bit sense lines 39, 41, 43 and 45 in FIG. 6, are charged to a positive potential VH and then bit sense line 41 is grounded and a voltage of, say, +5 volts is applied to the word line 24'. With bit sense line 39 being charged to +5 volts and with P+ region 42' having, e.g., a boron concentration of about 4–8×10$^{13}$ ions per square centimeter, the adjacent P+ region 42' is depleted of holes to neutralize the presence of P+ region 42' and current conducts through the channel region of transistor 54' which tends to discharge the voltage on bit sense line 39, indicating the storage of a "0" digit in the right side of transistor 54'.

The decrease in voltage on bit sense line 39 is detected by a first differential sense amplifier 51A' having amplifying transistors T10' and T12' and a control transistor T14' connected to bit sense line 41. It can be seen that with control transistor T14' connected as a diode, bit sense line 41 acts as a source for transistors T10' and T12' with the current passing through transistor T10' being dependent upon the voltage on bit sense line 39 and the current passing through transistor T12' being dependent upon a reference voltage, such as $V_{Ref.}$ or a voltage from a dummy cell, as is known. It should be noted that the cell storing a "0" digit in the left side of transistor 56' can be read out simultaneously with the sensing of the binary digit in the right side of transistor 54' by a third sense amplifier 51C' having amplifying transistors T22 and T24, and control transistors T26 and T28 connected to bit sense lines 41 and 45, respectively. With control transistor T26 connected as a diode, bit sense line 41 also acts as a source for transistors T22 and T24, whereas transistor T28 isolates the high voltage on bit sense line 45 from the amplifying transistors T22 and T24. A second sense amplifier 51B' having amplifying transistors T16' and T18' and control transistors T20' and T21 is turned off since bit sense line 41 is grounded and both bit sense lines 39 and 43 are at a high voltage.

To sense the cell in the right side of transistor 56' where a "1" digit is stored, line 43 is grounded with the other lines held at a high voltage. Since the N+ diffusion region 43 has a P+ region 44' adjacent thereto and under gate electrode 30', the N+ diffusion region has a high threshold and, therefore, current will not flow through the channel region of transistor 56' maintaining line 41 at a high potential. This high potential is detected by the second sense amplifier 51B' which now has line 43 acting as its source. Furthermore, a fourth sense amplifier 51D' having amplifying transistors T30 and T32 and control transistor T34 may be used to simultaneously sense the "1" digit stored in the left side of transistor 57. As can be seen, sense amplifier 51D' may have a second control transistor connected to additional bit sense lines, not shown.

It can be seen that up to one-third of the cells or bits on a common word line can be selected in pairs by pulsing their effective source diffusion to ground while holding all other bit sense lines at a positive potential. Furthermore, the sense amplifiers can be constructed on the very tight pitch of this array because the bit sense lines and the control circuitry functions can be combined as illustrated in FIG. 6 of the drawing. These sense amplifiers operate somewhat in the manner described in an article entitled "A 100 ns 150 mW 64 K bit ROM" by D. R. Wilson et al, 1978 *IEEE International Solid-State Circuits Conference, Digest of Technical Papers*, Volume XXI, pages 152, 153 and 273.

Although a word line voltage of +5 to +10 volts is suggested, it should be noted that the word line voltage preferably has a magnitude at which current readily flows through the channel region of the storage transistor when the cell being read out has a low threshold and at which current is prevented from flowing through the channel region when the cell being read out has a high threshold.

In the interest of clarity, only a small number of storage transistors have been illustrated in each of the embodiments. It should be understood, however, that each array of the storage system of the present invention may have 128 or more word lines and each word line may have associated therewith 128 or more storage transistors, i.e., 256 or more cells or stored bits per word line.

The read only memory has been described hereinabove as embodiments wherein binary information is stored in each cell. It can be seen that in accordance with the teachings of this invention, each cell can be made to store multiple levels of information by introducing one of several known quantities of the boron into the channel region of the transistors. For example, four cells can be made so that each cell has a different threshold voltage by, first implanting a given dose of boron into two cells, and second, implanting a second different dose of boron to one of previously implanted cells and one of the unimplanted cells.

By using suitable sense amplifiers, the four different levels of threshold of the cells can be detected. This multilevel capability may be expressed as the number of levels equals $2^M$, where M is the number of programming masks for M programming implants. For binary storage, M is equal to 1. Each transistor is coded to one of $2^M$ threshold levels.

It should be understood that impurities other than arsenic and boron may be used to practice this invention, e.g., antimony may be used instead of the arsenic. Also it should be noted that the invention may be used to make depletion type transistors as well as enhancement type transistors by implanting a fast diffusing donor, such as phosphorus, and using a suitable heat step to connect the two N+ diffusion regions 38 and 40. Furthermore, although the illustrated embodiments have been described as having a semiconductor substrate of P type conductivity, it should be noted that a semiconductor substrate of N type conductivity may be used by interchanging the N+ and P+ regions in the substrate.

Accordingly, it can be seen that a storage system having a high density transistor array which may be used in a read only memory, or if desired in a programmable logic array, has been provided. The density of the cells in this array is at least double the density of the cells of the array disclosed in the above identified A. G. Fortino et al U.S. Patent application with little or no additional cost.

While the invention has been particularly shown and described with reference to preferred embodiments thereof, it will be understood by those skilled in the art that various changes in form and details may be made therein without departing from the spirit and scope of the invention.

What is claimed is:

1. A storage system comprising;
a field effect transistor having a gate electrode and first and second spaced apart diffusions, at least one of said diffusions with said gate electrode having one of at least two different predetermined voltage thresholds,
means for applying a voltage having a polarity and magnitude sufficient to neutralize the highest of said at least two predetermined voltage thresholds to said first diffusion during a first time period and to said second diffusion during a second time period, and
means for sensing current flow between said spaced apart diffusions during said first and second time periods.

2. A storage system comprising;
a field effect transistor having a gate electrode and first and second spaced apart diffusions, said first diffusion with said gate electrode having a given voltage threshold and said second diffusion with said gate electrode having a lower voltage threshold than that of said given voltage threshold,
means for applying a voltage to said first diffusion having a polarity and magnitude sufficient to neutralize said given voltage threshold during a first time period,
means for applying said voltage to said second diffusion during a second time period, and
means for sensing current flow between said spaced apart diffusions during said first and second time periods.

3. A storage system comprising;
a plurality of field effect transistors, each having a gate electrode and first and second diffusions, at least some of said transistors having a given voltage threshold between said gate electrode and said first diffusion and a voltage threshold lower than that of said given threshold between said gate electrode and said second diffusion,
means for applying a voltage having a polarity and magnitude sufficient to decrease said given voltage threshold to said first diffusion during a first time period and to said second diffusion during a second time period, and
means for sensing current flow between said first and second diffusions during said first and second time periods.

4. A storage system comprising;
a given plurality of field effect transistors, each having a gate electrode and first and second diffusion regions, a first plurality of said field effect transistors each having a given voltage threshold between the gate electrode thereof and said first diffusion region and a voltage threshold lower than that of said given threshold between the gate electrode thereof and said second diffusion region, and a second plurality of said field effect transistors each having said given voltage threshold between the gate electrode thereof and said second diffusion region and said lower voltage threshold between the gate electrode thereof and said first diffusion region,
means for applying a voltage having a polarity and magnitude sufficient to decrease said given voltage thresholds to each of said first diffusion regions during a first time period and to each of said second diffusion regions during a second time period, and
means for sensing current between said first and second diffusion regions of each of said transistors of said plurality of transistors during said first and second time periods.

5. A storage system comprising;
A field effect transistor having a gate electrode and first and second spaced apart diffusions of a first conductivity type and a third diffusion of a second conductivity type disposed adjacent to one of said first and second diffusions under said gate electrode,
means for applying a voltage having a polarity and magnitude sufficient to eliminate the voltage threshold effects of said third diffusion on said transistor to said one diffusion during a first time period and to the other duffusion of said first and second diffusions during a second time period, and
means for sensing current flow between said first and second diffusions during said first and second time periods.

6. A storage system comprising;
a field effect transistor having first and second spaced apart diffusions of a given conductivity type, a gate electrode disposed between said diffusions and a third diffusion of an opposite conductivity type disposed adjacent to said first diffusion under said gate electrode,
means for applying a voltage to said first diffusion having a polarity and magnitude sufficient to eliminate the voltage threshold effects of said third diffusion on said transistor during a first time period, first means for determining current flow between said first and second diffusions during said first time period, means for applying said voltage to said second diffusion during a second time period, and second means for determining current flow between said first and second diffusions during said second time period.

7. A storage system as set forth in claim 6 wherein said first means determines current flow from said first diffusion to said second diffusion and said second means determines current flow from said second diffusion to said first diffusion.

8. A storage system as set forth in claim 7 wherein said given conductivity type is N+ type and said opposite conductivity type is P+ type and said voltage is a positive voltage.

9. A storage system as set forth in claim 8 wherein said first current determining means includes a first sense amplifier coupled to said first diffusion and wherein said second current determining means includes a second sense amplifier coupled to said second diffusion.

10. A read only memory comprising;

an array of field effect transistors, each transistor having first and second diffusions of a first conductivity type and a gate electrode and means for providing different voltage thresholds between said gate electrode and said first diffusion and said gate electrode and said second diffusion at selected transistors of said array, first means including bit sense lines for charging said first diffusion to a first voltage having a polarity and magnitude sufficient to eliminate the highest of said voltage thresholds between said gate electrode and said first diffusion and for grounding said second diffusion during a first time period, and second means including a word line connected to said gate electrodes having a second voltage applied thereto and sense amplifiers coupled between said first and second diffusions of said transistors for determining current flow through said transistors during said first time period, said first means further charging said second diffusion to said first voltage and grounding said first diffusion during a second time period, said second means further determining current flow through said transistors during said second time period.

11. A read only memory as set forth in claim 10 wherein said means for providing different voltage thresholds includes a third diffusion having a conductivity type opposite to that of said first conductivity type disposed adjacent to said first conductivity type diffusions.

12. A read only memory as set forth in claim 11 wherein said first conductivity type is N+ type and said opposite conductivity type is P+ type and said first and second voltages are positive voltages.

13. A read only memory comprising;

a field effect transistor having spaced apart diffusions interconnected by a channel, means for selectively increasing the threshold to channel conductivity of at least one of said diffusions, means for applying a voltage having a polarity and magnitude sufficient to neutralize said increased threshold to channel conductivity to one of said diffusions during a first time period and to the other of said diffusions during a second time period, and means for sensing current flow between said spaced apart diffusions during said first and second time periods.

14. A read only memory comprising;

a field effect transistor having first and second spaced apart diffusions, at least one of said diffusions having a higher of two given thresholds, means for applying a voltage having a polarity and magnitude sufficient to neutralize said higher threshold to said one diffusion during a first time period and to the other of said diffusions during a second time period, and means for determining current flow between said spaced apart diffusions during said first and second time periods.

15. A read only memory as set forth in claim 10 wherein each of said bit sense lines are shared by two of said transistors and each of said sense amplifiers sequentially determines current flowing through two of said transistors.

* * * * *